United States Patent
Hess et al.

(10) Patent No.: US 7,714,483 B2
(45) Date of Patent: May 11, 2010

(54) FUEL INJECTOR HAVING PIEZOELECTRIC ACTUATOR WITH PRELOAD CONTROL ELEMENT AND METHOD

(75) Inventors: Amy M. Hess, Metamora, IL (US); Daniel R. Ibrahim, Metamora, IL (US); Stephen R. Lewis, Chillicothe, IL (US); Jayaraman Venkataraghavan, Dunlap, IL (US); Shriprasad Lakhapati, Peoria, IL (US)

(73) Assignee: Caterpillar Inc., Peoria, IL (US)

( * ) Notice: Subject to any disclaimer, the term of this patent is extended or adjusted under 35 U.S.C. 154(b) by 0 days.

(21) Appl. No.: 12/077,640

(22) Filed: Mar. 20, 2008

(65) Prior Publication Data

US 2009/0236441 A1 Sep. 24, 2009

(51) Int. Cl.
*H01L 41/053* (2006.01)
*H01L 41/083* (2006.01)

(52) U.S. Cl. .................................................. 310/346
(58) Field of Classification Search .................. 310/346
See application file for complete search history.

(56) References Cited

U.S. PATENT DOCUMENTS

| | | | | |
|---|---|---|---|---|
| 3,673,442 A | * | 6/1972 | Sonderegger | 310/346 |
| 4,825,117 A | | 4/1989 | Thomas, III et al. | |
| 5,028,834 A | * | 7/1991 | Sakaida et al. | 310/328 |
| 5,059,850 A | * | 10/1991 | Yoshimura et al. | 310/328 |
| 5,126,618 A | * | 6/1992 | Takahashi et al. | 310/346 |
| 5,557,968 A | * | 9/1996 | Krempl et al. | 73/497 |
| 5,571,363 A | | 11/1996 | Brosig et al. | |
| 6,313,568 B1 | | 11/2001 | Sullivan et al. | |
| 6,633,108 B1 | | 10/2003 | Boecking | |
| 6,983,895 B2 | | 1/2006 | Augustin et al. | |
| 2005/0146248 A1 | * | 7/2005 | Moler et al. | 310/346 |
| 2006/0017349 A1 | * | 1/2006 | Moler et al. | 310/311 |

FOREIGN PATENT DOCUMENTS

JP 02 197180 * 8/1990

* cited by examiner

*Primary Examiner*—Thomas M Dougherty
(74) *Attorney, Agent, or Firm*—Liell & McNeil

(57) ABSTRACT

A fuel injector includes a piezoelectric actuator subassembly having a casing and a piezoelectric element disposed within the casing. The piezoelectric element has an operating temperature range and includes a thermally contractive material having a negative thermal expansion coefficient over a second temperature range overlapping with the operating temperature range. A preload control element is coupled with the piezoelectric element and includes a thermally expansive material having a positive thermal expansion coefficient over the second temperature range. The preload control element maintains a constant preload on the piezoelectric element over a wide temperature range to inhibit temperature induced variability in operation, and can axially lengthen in opposition to axial shortening of the piezoelectric element, responsive to a temperature increase.

8 Claims, 2 Drawing Sheets

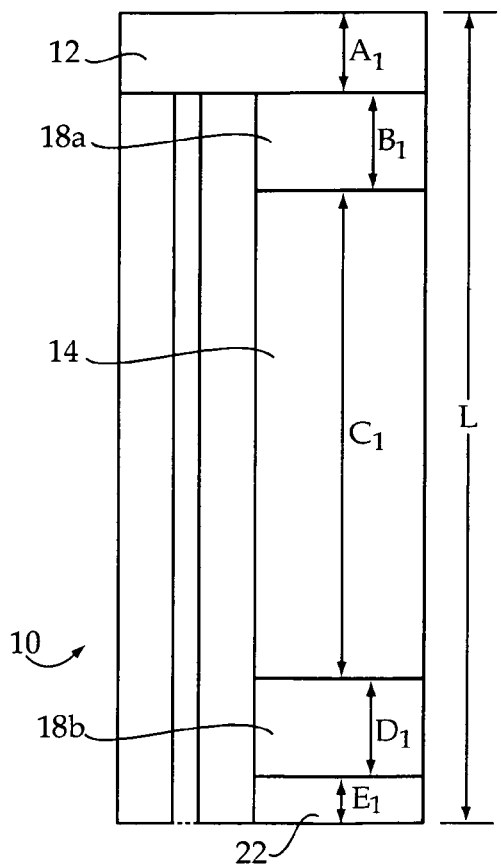
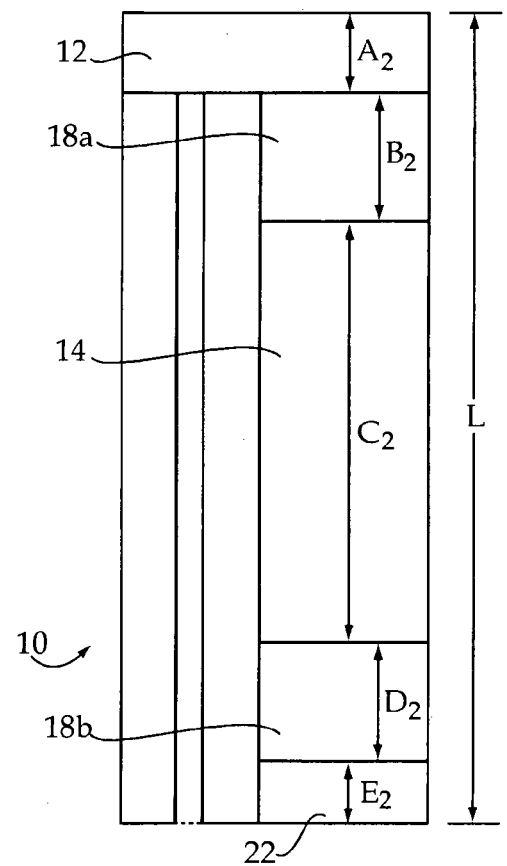
Figure 2a                    Figure 2b

FUEL INJECTOR HAVING PIEZOELECTRIC ACTUATOR WITH PRELOAD CONTROL ELEMENT AND METHOD

TECHNICAL FIELD

The present disclosure relates generally to piezoelectric actuators and piezoelectrically actuated devices, and relates more particularly to inhibiting variability in piezoelectric actuator operation via a thermally expansive preload control element.

BACKGROUND

Piezoelectric actuators are used with increasing frequency in a variety of applications, notably in fuel injectors. One common design utilizes a piezoelectric actuator to control the position of a control valve for controlling injection of fuel via a fuel injector. Piezoelectric actuators have been demonstrated to have certain advantages over conventional actuator systems such as solenoid actuators. In particular, piezoelectric actuators tend to be capable of relatively precise and repeatable operation under the demanding conditions commonly associated with fuel injector operation. The often superior performance of piezoelectric actuators has resulted in their displacing conventional actuators in certain types of fuel systems.

Despite the advantages offered by piezoelectric actuators, a unique set of challenges has arisen in connection with implementing piezoelectric actuators in commercially viable fuel injection systems. For example, it may be necessary to apply a preloading force to piezoelectric elements used in piezoelectric actuators so that they can function properly. In other words, piezoelectric elements are typically held in compression within an actuator subassembly or the like, and elongate against the compressive force when an electrical potential is applied to the piezoelectric element. Engineers have struggled with developing effective means for applying and maintaining a proper preload on piezoelectric elements. Piezoelectric actuators also tend to experience thermally induced dimensional changes when in service.

Many materials used in constructing piezoelectric actuators will tend to expand as their temperature increases. A preloading force applied to a piezoelectric element via a spring, etc., can therefore change as the piezoelectric actuator changes temperature. In many instances, it is desirable to set a preload on a piezoelectric element relatively precisely to ensure consistent operation. Because inconsistency in actuator operation can affect the ability of a fuel injector to function properly, potentially disrupting sophisticated injection timing strategies, variations in preload due to temperature changes can compromise overall engine performance.

U.S. Pat. No. 6,983,895 to Augustine et al. ("Augustine") is directed to a piezoelectric actuator having a compensator. In particular, a compensator is used in the piezoelectric actuator of Augustine which expands to compensate for a parallel expansion of a housing for the actuator. Augustine recognizes the importance of minimizing the effects of thermal expansion on the actuator, and may be beneficially implemented in certain environments. In other instances, however, particularly at certain temperature ranges or when using certain materials in construction of the actuator, Augustine may be ineffective.

SUMMARY

In one aspect, a piezoelectric actuator includes a casing and a piezoelectric element disposed within the casing which has an operating temperature range. The piezoelectric element includes a thermally contractive material with a negative thermal expansion coefficient over a second temperature range overlapping with the operating temperature range. The piezoelectric actuator further includes a preloading device applying a preload force to the piezoelectric element and a preload control element coupled with the piezoelectric element and including a thermally expansive material having a positive thermal expansion coefficient over the second temperature range.

In another aspect, a fuel injector includes an injector body and a control valve assembly positioned within the injector body. The fuel injector further includes an actuator subassembly for the control valve assembly, the actuator subassembly including a casing and a piezoelectric element disposed within the casing which includes a thermally contractive material. The actuator subassembly further includes a preloading device applying a preload force to the piezoelectric element, and a preload control element including a thermally expansive material adapted to lengthen in opposition to a shortening of the piezoelectric element, in response to a temperature increase.

In still another aspect, a method of inhibiting variability in operation of a piezoelectric actuator having a piezoelectric element includes a step of selecting one or more of a size, a composition and a thermal expansion coefficient of a preload control element based at least in part on a thermal contraction characteristic of the piezoelectric element. The method further includes a step of expanding the preload control element in opposition to a shortening of the piezoelectric element, in response to a temperature increase.

BRIEF DESCRIPTION OF THE DRAWINGS

FIG. 2a is a concept diagram of a piezoelectric actuator subassembly at a first temperature; and FIG. 2b is a concept diagram of the piezoelectric actuator subassembly of FIG. 2a at a second, higher temperature.

DETAILED DESCRIPTION

Figure 1:
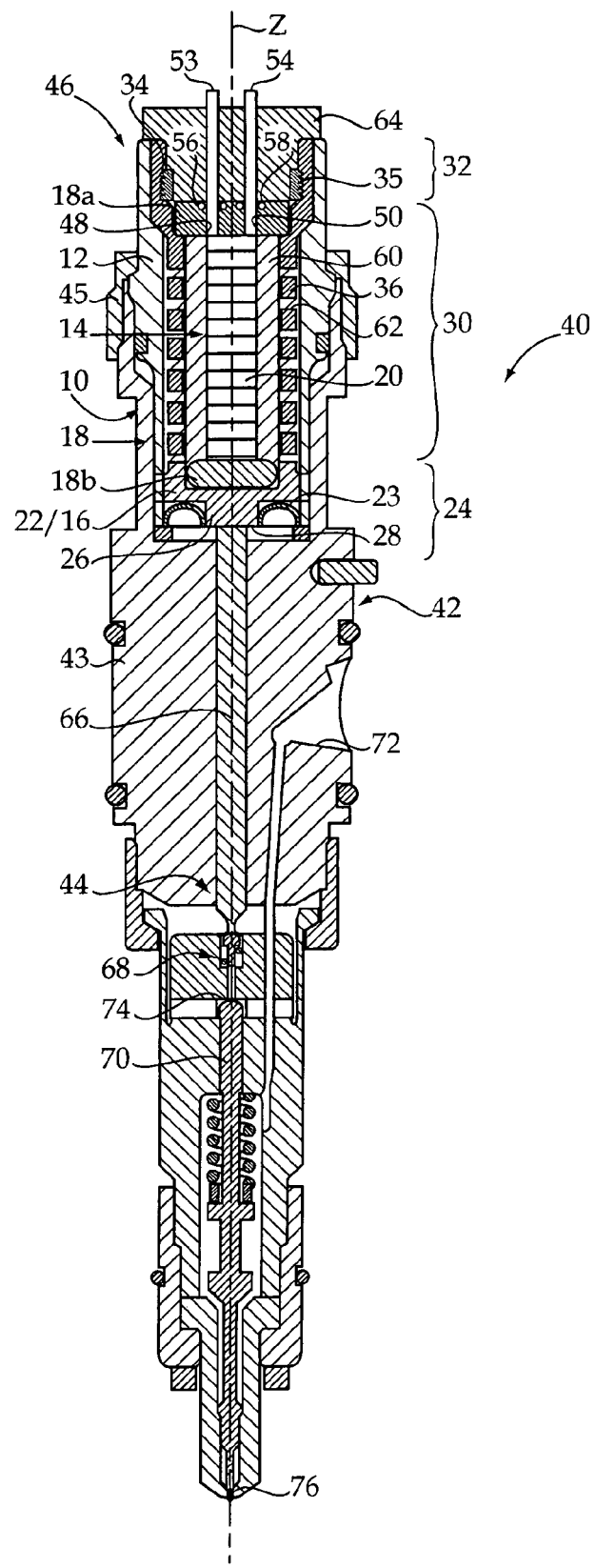
FIG. 1 is a partially sectioned side diagrammatic view of a fuel injector according to one embodiment.

Referring to FIG. 1, there is shown a fuel injector 40 according to one embodiment. Fuel injector 40 includes an injector body 42 having a first body piece 43 and a second body piece 45. An actuator subassembly 46 is mounted to injector body 42 and coupled between second body piece 45 and first body piece 43. In one embodiment, actuator subassembly 46 may be operably coupled with a control valve assembly 68 by way of a rod 66. Control valve assembly 68 may be configured to control a fluid pressure acting on a control surface 74 of an outlet check 70 of fuel injector 40. Fuel at a relatively high pressure may be supplied to fuel injector 40 via a fuel inlet 72, which fluidly connects with outlet check 70. In one embodiment, fuel inlet 72 may be configured to connect with a high pressure common rail in a fuel system (not shown) including fuel injector 40. Outlet check 70 may be movable between a first position and a second position to selectively connect a set of nozzle outlets 76 with inlet 72 to control injection of fuel with fuel injector 40 into a cylinder of an internal combustion engine, such as a direct injection compression ignition diesel engine. As will be apparent from the following description, actuator subassembly 46 may comprise a unique means of ensuring that variability in operation due to temperature changes is minimized. Inhibiting variability in operation will in turn reduce variability in operation of control valve assembly 44, and enable reliable operation of fuel injector 40 across a relatively broad range of temperatures.

Actuator subassembly 46 may comprise a piezoelectric actuator 10 having a casing 12 and a piezoelectric element 14 disposed within casing 12. Piezoelectric actuator 10 may further include a preloading device 16 which applies a preload force to piezoelectric element 14. In one embodiment, piezoelectric element 14 may comprise a stack of piezoelectric discs 20 which are held in compression via preloading device 16. Piezoelectric actuator 10 may further include a preload control element 18 coupled with piezoelectric element 14 and typically in contact therewith to maintain or control a preload on piezoelectric element 14, as further described herein.

In one embodiment, preloading device 16 may comprise a multi-function spring assembly 22 positioned within casing 12, and comprising a component separate from casing 12. Spring assembly 22 may include a first segment 24 having a piston 26 which includes a contact element 28 thereon which is configured to contact rod 66 for controlling control valve assembly 44. Spring assembly 22 may further include a second segment 30 which includes a spring 36 such as a helical spring having piezoelectric element 14 positioned at least partially therein, and a third segment 32. Spring 36 and other components of spring assembly 22 may be fluidly sealed within casing 12. In one embodiment, third segment 32 may include a set of threads 34 for engaging with a locking element 35 for setting or adjusting a preload on piezoelectric element 14 by expanding or contracting spring 36. Locking element 35 may comprise a threaded nut in one embodiment. A more complete explanation and discussion of the features and operating principles of a multi-function spring assembly similar to multi-function spring assembly 22 may be found in commonly owned and co-pending U.S. patent application Ser. No. 11/998,642.

Piezoelectric actuator 10 may further include a space 62, for example, defined in part by spring 36 which adjoins piezoelectric element 14. A thermal compensation material 60, such as a thermally conductive silicon gel or the like may be positioned in space 62 and in thermal contact with piezoelectric element 14. A flexible diaphragm 23 may be provided which is positioned between and coupled with piston 26 and casing 12, and configured to flex during activation and deactivation of piezoelectric element 14 in a known manner. Piezoelectric actuator subassembly 46 may further include a cap 64, a first electrical connector or electrical terminal 52 and a second electrical connector or electrical terminal 54 which extend through cap 64 for connecting with an engine electrical system (not shown) in a conventional manner. In one embodiment, preload control element 18 may include a first preload control disk 18a disposed at one end of piezoelectric element 14 and another preload control disk 18b disposed at an opposite end of piezoelectric element 14. Piezoelectric element 14 may thus be sandwiched between preload control disks 18a and 18b. Locking element 35 may abut preload control disk 18a, and piston 26 may abut preload control disk 18b. A rotation of locking element 35 can increase or decrease a compressive force defining a preload on piezoelectric element 14 by expanding or contracting spring 36. In other embodiments, a single preload control disk might be used, more than two preload control disks might be used, or the preload control disks could be positioned in actuator subassembly 46 in a configuration other than the one shown, such as abutting one another. In one practical implementation strategy preload control disks 18a and 18b will be arranged in series with piezoelectric element 14, and may have a common center axis with piezoelectric element 14 and with fuel injector 40. A longitudinal axis Z of fuel injector 40 is shown in FIG. 1, and comprises the common center axis. In one embodiment, preload control disk 18a may define a first bore 48 and a second bore 50. Electrical connectors 52 and 54 may extend respectively through bores 48 and 50, and a first sealing member 56 and a second sealing member 58, such as O-ring seals may each comprise a seal between bores 48 and 50 and the corresponding electrical connectors 52 and 54.

As mentioned above, actuator subassembly 46 may be uniquely adapted to inhibit variability in operation of piezoelectric actuator 10 due to temperature changes. It will be recalled that certain components of piezoelectric actuators undergo dimensional changes as their temperature changes. The present disclosure provides a method for compensating for such dimensional changes by selecting certain materials and characteristics of components of actuator subassembly 46 based on insights as to how the various materials behave at certain temperatures or within certain temperature ranges. While actuator strategies are known, such as Augustine, described above, which recognize changes in dimensions of components in response to temperature changes, and propose a method for compensating for such dimensional changes, these known strategies fail to fully account for the non-linear and relatively complex thermal behavior of certain materials. For instance, while conventional wisdom has long held that most materials, including piezoelectric materials, expand in response to temperature increases, such is not always the case. It has been discovered that across at least certain temperature ranges, piezoelectric materials may contract in response to a temperature increase. Thus, certain piezoelectric materials may be said to have a thermal contraction characteristic, which may include axial shortening, in response to a temperature increase. The present disclosure leverages this insight to enable maintaining a preload on piezoelectric element 14 despite temperature changes, as further described herein. Other embodiments may be adapted to change a preload on a piezoelectric element in response to temperature changes based on a target preload. In other words, rather than maintaining a constant preload, actuator subassembly 46 might be configured to increase or decrease a preload on piezoelectric element 14 in response to a temperature increase such that a target preload is achieved at a certain temperature.

Piezoelectric element 14 may have an operating temperature range, for example, having an upper end at about 150° C., and a lower end at about −40° C. Piezoelectric element 14 may further include a thermally contractive material which has a negative thermal expansion coefficient over a second temperature range which is between about 90° C. and about 120° C. and is thus overlapping with the operating temperature range. In other words, piezoelectric element 14 may include materials, such as piezoelectric crystalline materials, which contract when a temperature increase is experienced over a certain temperature range which comprises a sub-part, or is partially overlapping with, the operating temperature range. As mentioned above, the thermal behavior of piezoelectric element 14 may be relatively complex, and its thermal expansion coefficient may be positive over certain temperature ranges and negative over other temperature ranges. The second temperature range represents one optimum design temperature range, but could vary in different actuators or in different actuator applications.

During manufacturing of certain piezoelectric materials, such as those used in piezoelectric element 14, a relatively high electrical voltage may be applied to the piezoelectric materials to orient the piezoelectric crystals in a desired orientation to enable proper operation. This process is known in the art as "poling." In the case of at least certain piezoelectric materials, temperature increases can disturb the poling of the crystals developed during manufacturing. It has been discovered that disturbing the poling of piezoelectric crystals in piezoelectric elements such as piezoelectric element 14 can actually cause the piezoelectric element to contract. The present disclosure recognizes that disturbance of the poling of the piezoelectric crystals in the second temperature range, which may be for example within an upper one half of the operating temperature range, can cause piezoelectric element 14 to axially shorten.

One aspect of the present disclosure is thus the use of thermally expansive materials, such as aluminum and aluminum alloys, in preload control disks 18a and 18b to compensate for axial shortening of piezoelectric element 14 in the second temperature range. In particular, preload control element 18 may comprise a thermally expansive material which has a positive thermal expansion coefficient over the second temperature range. This feature allows preload control disks 18a and 18b to axially lengthen in opposition to axial shortening of piezoelectric element 14, in response to a temperature increase. In one embodiment, one or more of a size, a composition and a thermal expansion coefficient of preload control element 18 may be selected based at least in part on a thermal contraction characteristic such as axial shortening of piezoelectric element 14. During operation, as temperature of piezoelectric actuator 10 increases, preload control element 18 may expand or lengthen in opposition to shortening of piezoelectric element 14 to maintain or control a net preload on piezoelectric element 14 as desired.

INDUSTRIAL APPLICABILITY

Referring now to FIGS. 2a and 2b, there are shown concept diagrams of piezoelectric actuator 10 at a first temperature and at a second, higher temperature, respectively. The temperatures represented in FIGS. 2a and 2b may be a first temperature, FIG. 2a, at a lower end of the second temperature range, and a second temperature, FIG. 2b, at an upper end of the second temperature range. In FIG. 2a, casing 12 is shown having a length dimension $A_1$, first preload control disk 18a is shown having a length dimension $B_1$ and piezoelectric element 14 is shown having a length dimension $C_1$. Second preload control disk 18b has a length dimension $D_1$ whereas spring assembly 22 has a length dimension $E_1$. Together, the respective length dimensions comprise a length L of piezoelectric actuator 10.

In FIG. 2b, shown at a relatively higher temperature with respect to FIG. 2a, several of the length dimensions are different. Casing 12 has a second length dimension $A_2$ in FIG. 2b which is approximately the same as its length dimension $A_1$ shown in FIG. 2a. In one embodiment, casing 12 may be manufactured from materials having a thermal expansion coefficient relatively close to or equal to zero, such as materials commonly available under the trade name INVAR®. In one specific embodiment, a positive thermal expansion coefficient of casing 12 may be about $0.12 \times 10^{-5}$ meters/meter-Kelvin over the second temperature range described above. Also shown in FIG. 2b is the relatively larger length dimension $E_2$ of spring assembly 22. In one embodiment, spring assembly 22 may be formed from a steel material having a positive thermal expansion coefficient of about $1.2 \times 10^{-5}$ meters/meter-Kelvin, over the second temperature range. Each of preload control disks 18a and 18b may comprise aluminum, as mentioned above, and may be positioned in parallel with casing 12. In one embodiment, each of preload control disks 18a and 18b has a relatively greater length $B_2$ and $D_2$, respectively, in FIG. 2b. An absolute value of the thermal expansion coefficient of the material of which casing 12 is made may be less than the absolute value of the thermal expansion coefficient of the material comprising preload control element 18, and may also be less than the absolute value of the thermal expansion coefficient of the material comprising piezoelectric element 14. The aluminum or other material of which preload control disks 18a and 18b are formed may have a positive thermal expansion coefficient of about $2.5 \times 10^{-5}$ meters/meter-Kelvin over the second temperature range. Piezoelectric element 14 may have a relatively shorter length $C_2$ at a relatively higher temperature, as shown in FIG. 2b. In one embodiment, piezoelectric element 14 may be comprised of a ceramic material having a negative thermal expansion coefficient of about $-0.3 \times 10^{-5}$ meters/meter-Kelvin, over the second temperature range.

In the illustrations shown in FIGS. 2a and 2b the dimensional changes among the various components are somewhat exaggerated. It should be noted, however, that in either case the total length L of actuator 10 remains approximately the same at the temperature conditions illustrated in FIGS. 2a and 2b. It is contemplated that maintaining a length of actuator 10 relatively constant across the second temperature range, and in many instances across its entire operating range, will provide certain advantages. Returning to FIG. 1, there will typically be a relatively small air gap between rod 66 and piston 26. It will generally be desirable to minimize a change in the size of this air gap during temperature changes. Hence, maintaining the length of actuator 10 across a relatively wide temperature range may inhibit change or variability in operation of actuator 10 which might otherwise result due to a change in the size of the air gap between piston 26 and rod 66. By implementing the teachings of the present disclosure, a net air gap change between rod 66 and piston 26 may be about 9 microns or less. Moreover, preload on piezoelectric element 14 may be substantially the same regardless of temperature, also reducing or eliminating variability in operation of actuator 10 at different temperatures.

Much of the foregoing description emphasizes tailoring thermal expansion characteristics of preload control element 18 to compensate for thermal contraction characteristics of piezoelectric element 14. It should be appreciated, however, that a multiplicity of factors may bear on the selection of suitable materials having appropriate thermal expansion or contraction characteristics in constructing actuator 10, and other components of actuator subassembly 46. For instance, as mentioned above, spring 36 may have a spring constant negatively correlated with temperature increase. In other words, the relative compressive force available via spring 36 for preloading piezoelectric element 14 may decrease as a temperature of spring 36 increases. Change in the spring constant of spring 36 may occur in parallel with the dimensional changes illustrated in FIGS. 2a and 2b. Accordingly, in selecting a size, composition and/or thermal expansion coefficient for preload control element 18, the relative change in preloading force available via spring 36 might also be considered. The size, composition and/or thermal expansion coefficient of preload control element 18 may thus be based on the spring constant of spring 36 as well as the thermal contraction characteristic of piezoelectric element 14. Where spring 36 experiences a relatively larger decrease in spring constant for a given temperature increase, it may be desirable to select a material for preload control element 18 having a relatively greater coefficient of thermal expansion, at least in a temperature range corresponding to the given temperature increase. The converse may also be true, and where a spring constant of spring 36 is relatively less susceptible to change for a given temperature increase, the thermal expansion coefficient of preload control element 18 might be selected to be relatively less for the given temperature increase.

The present description also discusses maintaining preload on piezoelectric element 14 and maintaining a length L of actuator 10. One practical implementation strategy will thus be engineering actuator 10 such that its dimensions and the preload remain relatively constant regardless of temperature. In other instances, however, preload on piezoelectric element 14 and even dimensions of actuator 10 might be intended to change in response to a temperature increase. In one embodiment, preload on piezoelectric element 14 may be initially set relatively lower than a target preload, and the materials and components of actuator 10 designed and configured such that preload on piezoelectric element 14 increases as temperature increases, towards a target preload. Thus, the present disclosure should be understood as encompassing a variety of different systems where preload is controlled on a piezoelectric element to be at a desired preload at certain temperatures. This may be the case regardless of whether preload is maintained at a constant preload, increased in response to a temperature increase or decreased in response to a temperature increase.

The present description is for illustrative purposes only, and should not be construed to narrow the breadth of the present disclosure in any manner. Thus, those skilled in the art will appreciate that various modifications might be made to the presently disclosed embodiments without departing from the full and fair scope and spirit of the present disclosure. Other aspects and features will be apparent upon an examination of the attached drawings and appended claims.

What is claimed is:

1. A piezoelectric actuator comprising:
   a casing;
   a piezoelectric element disposed within the casing and having an operating temperature range, the piezoelectric element including a thermally contractive material having a negative thermal expansion coefficient over a second temperature range overlapping with the operating temperature range;
   a preloading device applying a preload force to the piezoelectric element;
   a preload control element coupled with the piezoelectric element and comprising a thermally expansive material having a positive thermal expansion coefficient over the second temperature range; and
   at least one sealing element fluidly sealing the piezoelectric element within the casing.

2. The piezoelectric actuator of claim 1 wherein at least one of, a size, a composition and the thermal expansion coefficient of the preload control element is based in part on a thermal contraction characteristic of the piezoelectric element.

3. The piezoelectric actuator of claim 2 wherein the preload control element, the piezoelectric element and the preloading device are arranged in series and have a common center axis, wherein the thermal contraction characteristic comprises an axial shortening of the piezoelectric element, and wherein the preload control element is configured to axially lengthen responsive to a temperature increase in opposition to the axial shortening of the piezoelectric element.

4. A piezoelectric actuator comprising:
   a casing;
   a piezoelectric element disposed within the casing and having an operating temperature range, the piezoelectric element including a thermally contractive material having a negative thermal expansion coefficient over a second temperature range overlapping with the operating temperature range;
   a preloading device applying a preload force to the piezoelectric element; and
   a preload control element coupled with the piezoelectric element and comprising a thermally expansive material having a positive thermal expansion coefficient over the second temperature range;
   wherein at least one of, a size, a composition and the thermal expansion coefficient of the preload control element is based in part on a thermal contraction characteristic of the piezoelectric element;
   wherein the preload control element, the piezoelectric element and the preloading device are arranged in series and have a common center axis, wherein the thermal contraction characteristic comprises an axial shortening of the piezoelectric element, and wherein the preload control element is configured to axially lengthen responsive to a temperature increase in opposition to the axial shortening of the piezoelectric element; and
   wherein the preloading device comprises a spring fluidly sealed within the casing, and wherein the piezoelectric element comprises a stack of piezoelectric discs positioned at least partially within the spring.

5. The piezoelectric actuator of claim 4 further comprising a multi-function spring assembly positioned within the casing, the multi-function spring assembly having a first segment which includes a piston having a contact element thereon, a second segment which includes the spring, and a third segment which includes threads for setting or adjusting the preload force.

6. The piezoelectric actuator of claim 4 wherein the preload control element includes a plurality of preload control discs and wherein the stack of piezoelectric discs is sandwiched between the plurality of preload control discs.

7. The piezoelectric actuator of claim 6 wherein the preload control element is positioned in parallel with the casing and the casing has a thermal expansion coefficient, and wherein an absolute value of the thermal expansion coefficient of the casing is less than the thermal expansion coefficient of the preload control element.

8. The piezoelectric actuator of claim 7 wherein the absolute value of the thermal expansion coefficient of the casing is about $0.12 \times 10^{-5}$ meters per meter-Kelvin or less.

* * * * *